US008223480B2

United States Patent
Dong

(10) Patent No.: US 8,223,480 B2
(45) Date of Patent: Jul. 17, 2012

(54) PENDANT MOUNTING STRUCTURE AND PORTABLE ELECTRONIC DEVICE USING SAME

(75) Inventor: Shui-Jin Dong, Shenzhen (CN)

(73) Assignees: ShenZhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 0 days.

(21) Appl. No.: 12/878,235

(22) Filed: Sep. 9, 2010

(65) Prior Publication Data

US 2011/0228455 A1  Sep. 22, 2011

(30) Foreign Application Priority Data

Mar. 22, 2010 (CN) ................ 2010 2 0137223 U

(51) Int. Cl.
*G06F 1/16* (2006.01)
*H05K 5/00* (2006.01)
*H05K 7/00* (2006.01)
*H04M 1/00* (2006.01)

(52) U.S. Cl. ............ 361/679.03; 361/679.58; 455/575.8

(58) Field of Classification Search ............ 361/679.01–679.03, 679.58; 455/575.8
See application file for complete search history.

(56) References Cited

U.S. PATENT DOCUMENTS

| | | | | |
|---|---|---|---|---|
| 4,158,197 A * | 6/1979 | Takagaki | ............. | 340/574 |
| 4,758,855 A * | 7/1988 | Tamamura et al. | ............. | 396/536 |
| 5,737,412 A * | 4/1998 | Yamashita | ............. | 379/446 |
| 6,655,540 B2 * | 12/2003 | Shimoda et al. | ............. | 220/4.02 |
| 7,035,110 B1 * | 4/2006 | Wang et al. | ............. | 361/737 |
| 7,095,617 B1 * | 8/2006 | Ni | ............. | 361/736 |
| 7,172,460 B2 * | 2/2007 | Zhao et al. | ............. | 439/607.56 |
| 7,214,075 B2 * | 5/2007 | He et al. | ............. | 439/135 |
| 7,341,464 B2 * | 3/2008 | Cuellar et al. | ............. | 439/135 |
| 7,503,780 B1 * | 3/2009 | Huang | ............. | 439/135 |
| 7,715,192 B2 * | 5/2010 | Takahama | ............. | 361/679.59 |
| 8,014,133 B2 * | 9/2011 | Dong et al. | ............. | 361/679.01 |
| 8,014,143 B2 * | 9/2011 | Chang | ............. | 361/679.31 |
| 2002/0044406 A1 * | 4/2002 | Shimoda et al. | ............. | 361/679 |
| 2002/0141572 A1 * | 10/2002 | Rogalski | ............. | 379/449 |
| 2006/0138182 A1 * | 6/2006 | Carlsson | ............. | 224/257 |
| 2010/0033911 A1 * | 2/2010 | Chang et al. | ............. | 361/679.01 |
| 2010/0035666 A1 * | 2/2010 | Chang et al. | ............. | 455/575.1 |

* cited by examiner

*Primary Examiner* — Jinhee Lee
*Assistant Examiner* — Adrian S Wilson
(74) *Attorney, Agent, or Firm* — Altis Law Group, Inc.

(57) ABSTRACT

A pendant mounting structure comprises a main body, a hook and two latching elements. The main body includes an upper surface and opposite side surfaces perpendicular to the upper surface and positioned at two side of the main body. The hook protrudes from the upper surface. The latching elements protrude from two sides of the main body. The pendant mounting is separately manufactured and latched to a housing. Thus, when an external force exerted on the hook is more than the structural limit of the hook, the hook could be break to protect the housing from damage.

3 Claims, 4 Drawing Sheets

PENDANT MOUNTING STRUCTURE AND PORTABLE ELECTRONIC DEVICE USING SAME

BACKGROUND

1. Technical Field

The present disclosure generally relates to pendant mounting structures, particularly to pendant mounting structures used in portable electronic devices.

2. Description of Related Art

With the development of technologies, portable electronic devices such as mobile phones, MP3s, digital cameras and personal digital assistants (PDAs) are now in widespread use, and consumers may now enjoy the full convenience of high technology products almost anytime and anywhere. Nowadays, users of the portable electronic device may enjoy adorning a pendant for mounting accessories on the portable electronic device, to add personalization and improve overall appearance of the portable electronic device. The pendant is generally hung on a rope, and the housing of the portable electronic device has a hole defined for accommodating the rope. When assembling the pendant onto the portable electronic device, first the rope is inserted through the hole, and then a knot is tied to secure the pendant to the portable electronic device.

However, it can be difficult to insert the rope through the hole, as the hole usually is small. Additionally, when an external force exerted on the rope exceeds the structural limit of the housing, the housing may be damaged.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary pendant mounting structure and portable electronic device using the pendant mounting structure. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
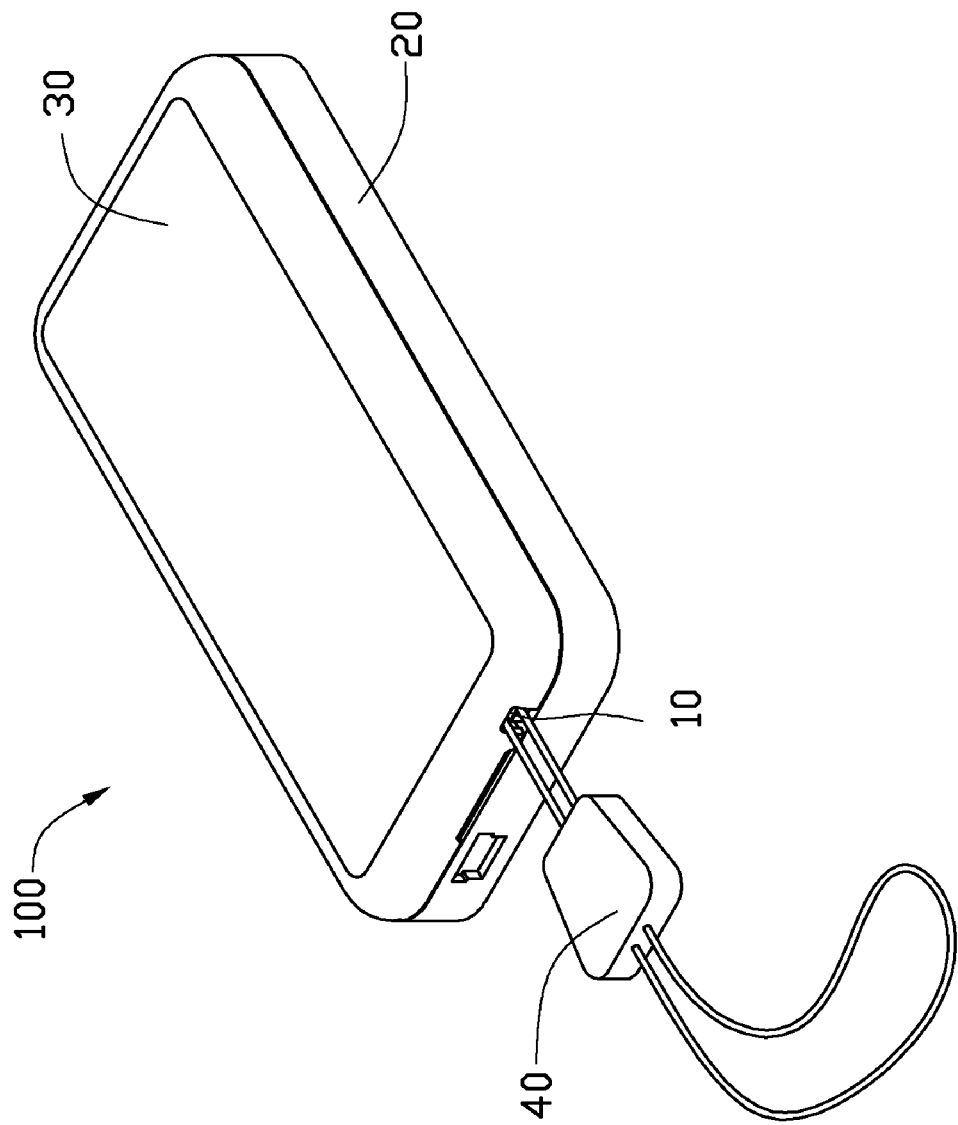
FIG. 1 is an assembled perspective view of an exemplary embodiment of a pendant mounting structure using in a portable electronic device including a pendant mounting structure, a housing and a cover.
Figure 2:
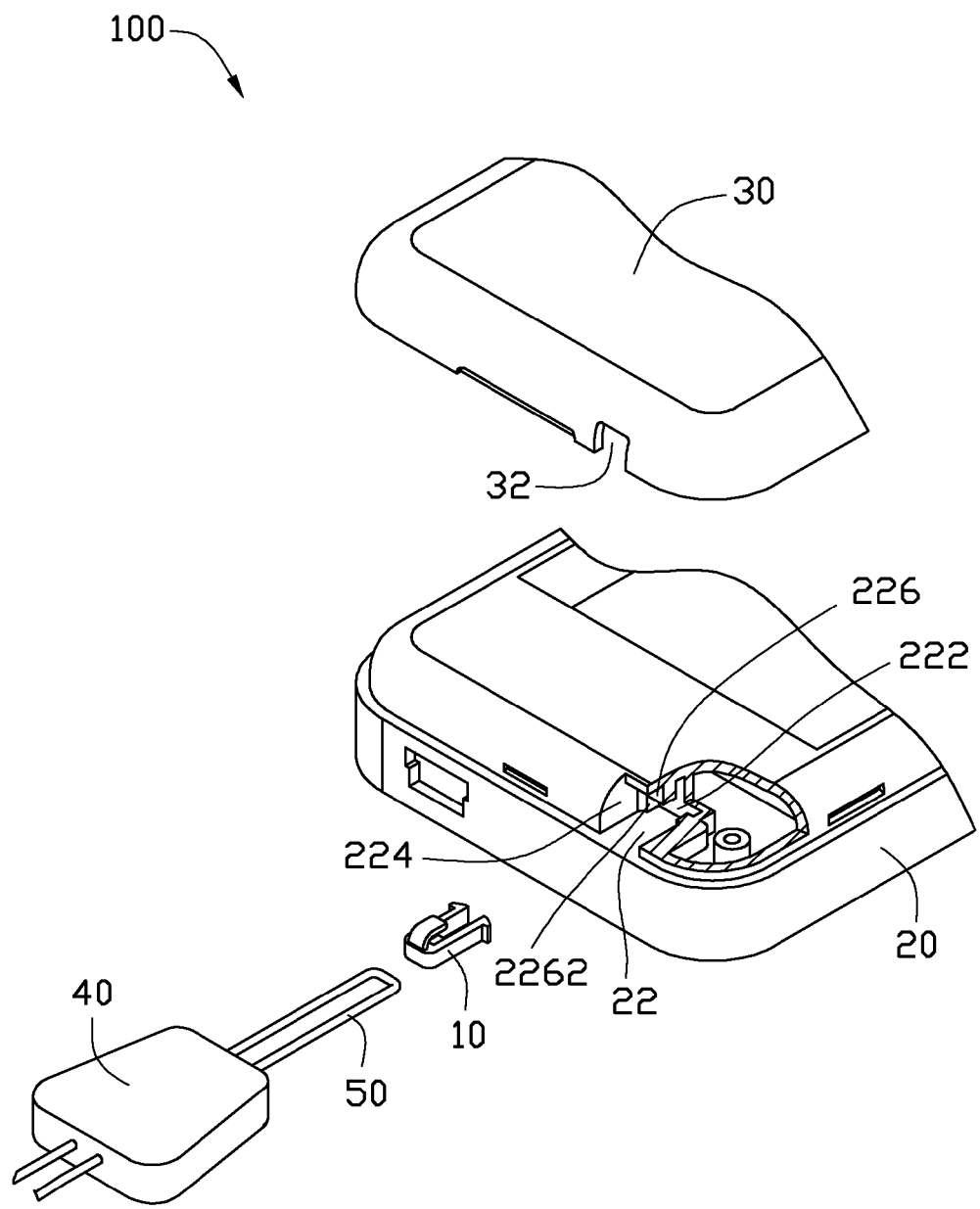
FIG. 2 is an exploded perspective view of the portable electronic device shown in FIG. 1.

Referring to FIGS. 1 and 2, an exemplary pendant mounting structure 10 used in a portable electronic device 100 for hanging a pendant 40 (e.g., decorative element) is shown. The portable electronic device 100 described here may be a mobile phone, an MP3, a digital camera or a personal digital assistant (PDA), etc. The portable electronic device 100 includes a pendant mounting structure 10, a housing 20 and a cover 30. The pendant mounting structure 10 is mounted to the housing 20 for hanging a rope 50 of the pendant 40 from the portable electronic device 100.

Figure 3:
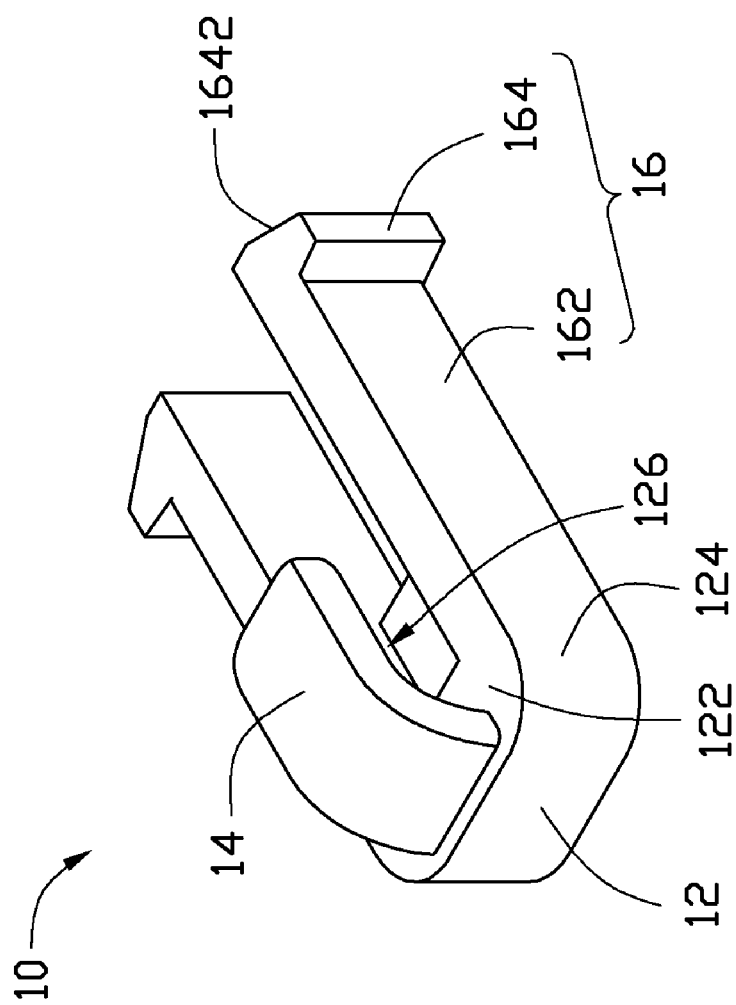
FIG. 3 is a perspective view of the exemplary pendant mounting structure.

Also referring to FIG. 3, the pendant mounting structure 10 includes a main body 12, a hook 14 and two latching elements 16. The main body 12 includes an upper surface 122 and opposite side surfaces 124 perpendicular to the upper surface 122 and positioned at opposite sides of the main body 12. The hook 14 protrudes from one end of the upper surface 122 and extends toward another opposite end of the upper surface 122 such that a gap 126 is formed between the main body 12 and the hook 14. The latching elements 16 are parallel hooks protruding from each side of the main body 12 and located on opposite sides of the hook 14. Each latching element 16 is substantially L-shaped. Each latching element 16 includes a connecting portion 162 connecting to the main body 12 and a latching portion 164 extending outwardly from a distal end of the corresponding connecting portion 162. Each latching portion 164 includes a sloping surface 1642 formed at the distal end of the latching portion for facilitating assembling the pendant mounting structure 10.

Figure 4:
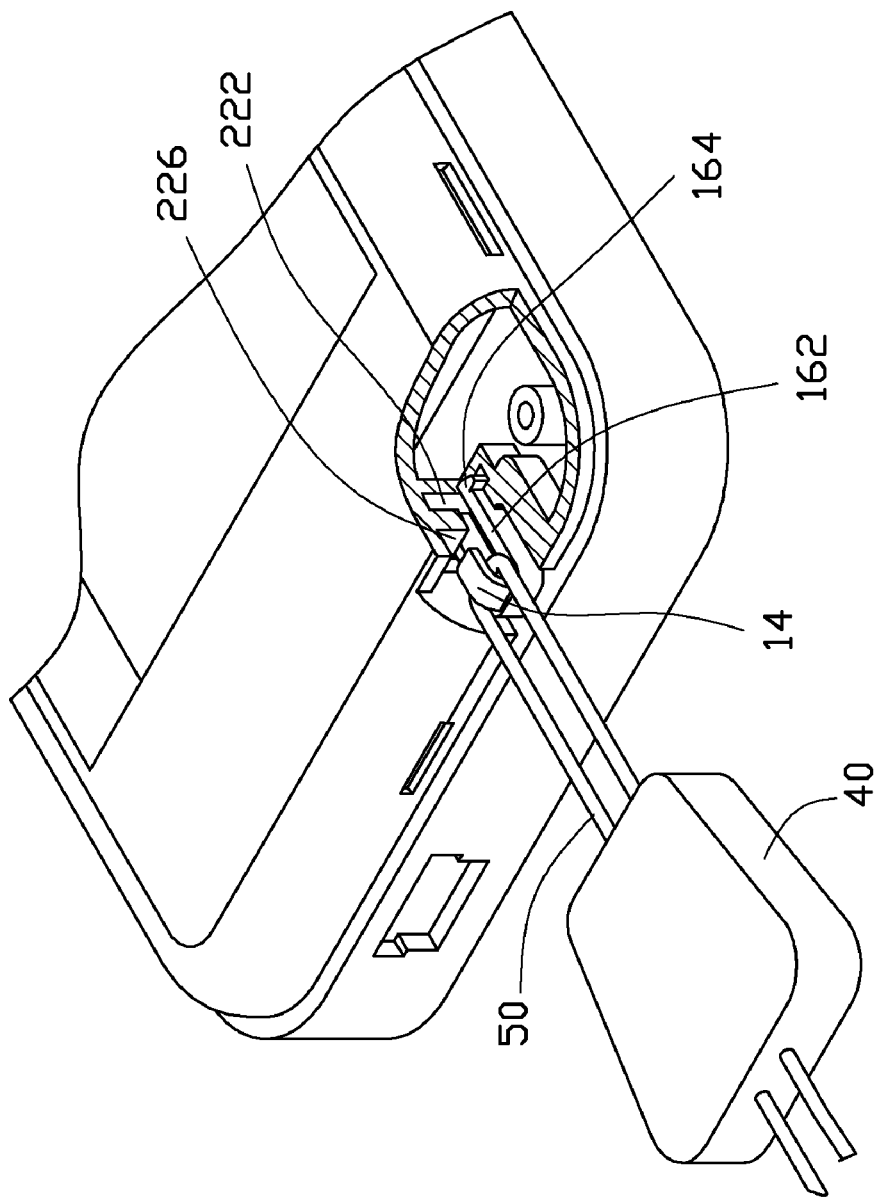
FIG. 4 is a partially assembled perspective view of the portable electronic device, wherein the cover is detached from the housing.

Referring to FIG. 2 and FIG. 4, the housing 20 has a mounting portion including a slot 22 defined in the mounting portion corresponding to the pendant mounting structure 10. The slot 22 includes a bottom wall 222 and opposite side walls 224. A support rib 226 is formed between the two side walls 224 and parallel to the bottom wall 222. Each end of the support rib 226 perpendicularly connects it corresponding side wall 224. An assembling hole 2262 is defined through the support rib 226 for assembling the pendant mounting structure 10 thereto. The dimension of the assembling hole 2262 is substantially the same as the distance between the two connecting portions 162, such that, the two latching portions 164 of the pendant mounting structure 10 pass through the assembling hole 2262 and latch to the support rib 226.

A notch 32 defined through the cover 30 corresponds to the slot 22. When the cover 30 is mounted to the housing 20, the notch 32 is aligned with the slot 22, so that the rope 50 can extend outwardly from the notch 32.

Referring to FIG. 4, when assembling the portable electronic device 100, the latching portions 164 of the pendant mounting structure 10 align with the assembling hole 2262 and are pressed toward each other to pass through the assembling hole 2262. The two sloping surfaces 1642 are compressed and resist against the opposite inner wall surfaces of the assembling hole 2262. Once the latching portions 164 of the latching elements 16 entirely pass through the assembling hole 2262, the latching elements 16 return to their original shape so that the latching portions 164 latch to the support rib 226 and located between the support rib 226 and the bottom wall 222. Additionally, the main body 12 is accommodated within the slot 22. Thus, the pendant mounting structure 10 is firmly mounted to the housing 20.

After that, the rope 50 is looped over the hook 14 of the pendant mounting structure 10 and partially accommodated within the gap 126. The cover 30 is mounted to the housing 20, i.e., completing an assembled portable electronic device 100.

The pendant mounting structure 10 is separately manufactured and latched to the housing 20. When an external force exerted on the rope 50 is more than the structural limit of the hook 14, the hook 14 could be break to protect the housing 20 from damage.

It is to be understood, however, that even though numerous characteristics and advantages of the exemplary disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A portable electronic device, comprising:
   a housing; and
   a pendant mounting structure comprising:
   a main body;
   a hook protruding from one surface of one end of the main body and extending toward another end of the main body such that a gap is formed between the main body and the hook configured for attaching a pendant thereon; and
   two latching elements protruding the main body and detachably mounted to the housing;
   wherein the housing has a mounting portion including a slot, the slot includes a bottom wall and opposite side walls, a support rib is formed between the two side walls and parallel to the bottom wall; an assembling hole is defined through the support rib, each latching element includes a connecting portion and a latching portion, the two latching portions pass through the assembling hole and latch to the support rib.

2. The pendant mounting structure as claimed in claim 1, wherein the two ends of the support rib perpendicularly connect to the two side walls.

3. The pendant mounting structure as claimed in claim 1, wherein the dimension of the assembling hole is substantially the same as the distance between the two connecting portions.

* * * * *